United States Patent [19]
Boe et al.

[11] Patent Number: 5,875,560
[45] Date of Patent: Mar. 2, 1999

[54] METHOD AND APPARATUS FOR ALIGNING SURFACES IN CLOSE PROXIMITY

[75] Inventors: Jeff Boe, Austin; Robert Lemmons, Round Rock, both of Tex.

[73] Assignee: Applied Materials, Inc., Santa Clara, Calif.

[21] Appl. No.: 754,728

[22] Filed: Nov. 21, 1996

[51] Int. Cl.$^6$ .............................. G01D 21/02; G08B 21/00
[52] U.S. Cl. ................................ 33/645; 33/533; 33/366; 340/686
[58] Field of Search ...................................... 33/1 PT, 366, 33/533, 613, 626, 645, 551, 552, 553, 554, 555; 340/686, 689; 341/34

[56] References Cited

U.S. PATENT DOCUMENTS

| | | | |
|---|---|---|---|
| 3,805,036 | 4/1974 | Michaud et al. | 33/533 |
| 4,152,839 | 5/1979 | McDonald | 33/366 |
| 4,428,125 | 1/1984 | West, Jr. | 33/366 |
| 5,058,451 | 10/1991 | Fujimoto et al. | 340/686 |
| 5,241,308 | 8/1993 | Young | 341/34 |
| 5,432,503 | 7/1995 | Pekar | 340/686 |
| 5,640,779 | 6/1997 | Rolloff et al. | 33/552 |
| 5,729,221 | 3/1998 | Krolopp et al. | 341/34 |

*Primary Examiner*—G. Bradley Bennett
*Attorney, Agent, or Firm*—Patterson & Associates

[57] ABSTRACT

Apparatus and method are disclosed for adjusting the alignment of surfaces in close proximity. The apparatus includes at least three travel sensitive switches fixed in a non-linear configuration, each switch having a known actuating distance, and a display connected to the switches to show the status of each switch. In order to align two surfaces in parallel, the switches have essentially the same actuating distance. The switches are placed between the surfaces and the surfaces are moved together until the display shows that one or more switches is actuated. The information provided by the switches guides alignment of the surfaces to achieve essentially simultaneous actuation of all switches having actuating distances which correspond to a desired alignment when the surfaces are moved within the actuating distances of the switches. A second set of at least three travel sensitive switches having a smaller actuating distance than the first set of switches can be used to simplify the alignment process. The apparatus and method are especially useful in aligning parallel surfaces in chemical vapor deposition equipment for making integrated circuits.

20 Claims, 2 Drawing Sheets

METHOD AND APPARATUS FOR ALIGNING SURFACES IN CLOSE PROXIMITY

FIELD OF THE INVENTION

This invention relates to a method and apparatus for aligning surfaces which are in close proximity. More particularly, this invention relates to a method and apparatus for aligning parallel surfaces in a chemical vapor deposition process for making an integrated circuit.

BACKGROUND OF THE INVENTION

In the construction of modern electronic devices such as integrated circuits, device geometries are constantly shrinking, resulting in a need for smaller processing equipment for making the devices. Alignment of process components is often a limiting factor in the ability to reduce the size of process equipment. As an example, chemical vapor deposition methods for making integrated circuits use a deposition chamber wherein a perforated vapor distribution plate is ideally situated about 300 mil from a support platform for the integrated circuit work piece. The distribution plate and the support platform ideally have parallel surfaces and experiments show that the best results are obtained when the surfaces are aligned in parallel within a very small tolerance. Such alignment is achievable by the combination of careful adjustment and close examination of product variances. However, there is no simple and economical apparatus or method for aligning surfaces in such close proximity.

SUMMARY OF THE INVENTION

The present invention provides a method and apparatus for adjusting the alignment of surfaces in close proximity. The apparatus comprises at least three travel sensitive switches fixed in a non-linear configuration, each switch having a known actuating distance, and a display connected to the switches to show the status of each switch. In order to align two surfaces in parallel, the switches must have essentially the same actuating distance. The switches are positioned between the surfaces and the surfaces are moved together until the display shows that one or more switches is actuated. The information provided by the switches guides alignment of the surfaces to achieve essentially simultaneous actuation of all switches having actuating distances which correspond to a desired alignment when the surfaces are moved within the actuating distances of the switches. A second set of at least three travel sensitive switches having smaller actuating distances than the first set of switches can be used to simplify the alignment process. The apparatus and method are especially useful in aligning parallel surfaces in chemical vapor deposition equipment for making integrated circuits.

DETAILED DESCRIPTION OF THE INVENTION

The present invention provides a method and apparatus for adjusting the alignment of surfaces in close proximity. The apparatus broadly includes at least three travel sensitive switches fixed in a non-linear configuration, each switch having a known actuating distance, and a display connected to the switches to show the status of each switch. The travel sensitive switches are positioned between two surfaces that are to be aligned and the switches are actuated when the distance between the surfaces provides sufficient movement of the switch. The distance between the surfaces which provides sufficient movement to actuate a travel sensitive switch is termed the actuating distance.

At least three switches having known actuating distances are positioned in a non-linear configuration in order to establish the separation between the planes of the surfaces which are to be aligned. A plane is defined by three non-linear points and the alignment of two planes is established by knowing the separation between the planes at three non-linear points.

Three switches in a non-linear configuration preferably have the same actuating distance so that the switches will actuate at essentially the same time when the surfaces are moved into parallel alignment. When non-parallel alignment is desired, the non-linear switches can be selected to have different actuating distances which correspond to a desired alignment.

The travel sensitive switches must be of a design that withstands further convergence of the surfaces to be aligned after actuation of the switch in order to tolerate misalignment of the surfaces. Such switches, typically known as bubble switches, are readily available for the operation of computer and calculator keyboards. The available switches will tolerate such an excessive amount of movement that switches having smaller actuating distances can be included in the same apparatus to further assist in alignment of the surfaces. Although the bubble switches are not routinely manufactured to have a narrow range of actuating distances, the actuating distance of each switch is readily measured by pressing the switch between two exposed surfaces and measuring the distance between the surfaces at the time the switch actuates. Thus, the switches can be tested and matched for use in the apparatus of this invention and can be retested after a period of use to confirm that the switches have actuating distances which correspond to a desired alignment.

Figure 1:
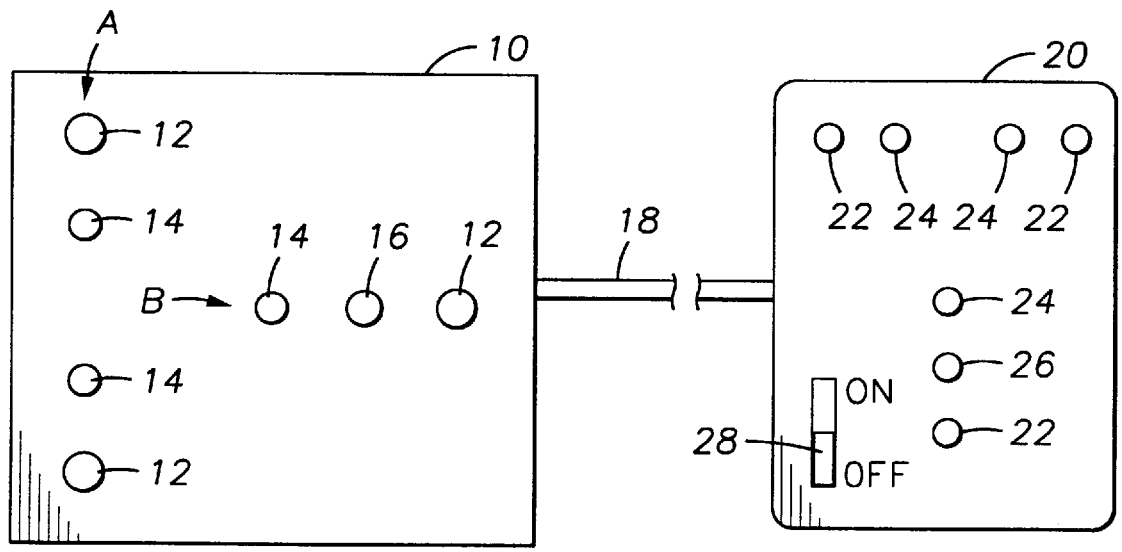
FIG. 1 is a schematic view of a preferred apparatus of the invention showing a keypad having first and second sets of three non-linear bubble switches connected to a hand held display for monitoring the status of the switches.

A preferred embodiment of the apparatus of the invention is shown in FIG. 1. A keypad 10 comprises a plurality of bubble switches 12, 14, 16 in a non-linear configuration on perpendicular lines A and B. The bubble switches 12, 14, 16 are connected to a hand held display 20 by wires 18. The hand held display 20 uses batteries (not shown) to power a plurality of simple circuits which connect each bubble switch 12, 14, 16 to a corresponding light emitting diode (LED) 22, 24, 26 mounted on the face of the display 20. The display has a conventional on/off switch 28 which will shut down the apparatus for storage or reset the switches 12, 14, 16 to a ready position.

A first set of three non-linear switches 12 have essentially a first actuating distance and are monitored by corresponding LEDs 22. A second set of three non-linear switches 14 have essentially a second actuating distance and are monitored by corresponding LEDs 24. The remaining switch 16 has an intermediate actuating distance and is monitored by corresponding LED 26. As shown, the switches 12 have a greater actuating distance than switches 14 although the relative order of the switches is not critical. The second set of switches 14 assist in aligning the surfaces but are not needed to achieve alignment unless the surfaces move too rapidly for visual confirmation of simultaneous actuation of the first switches 12.

The switches 12, 14, 16 are preferably positioned in a "T" formation since alignment of a surface will typically require a pitch or roll adjustment or a combination of both. The T formation is most useful when it is reasonably possible to position a first line A of bubble switches, including two switches 12 having essentially the same actuating distance, perpendicular to an axis of rotation of the surface. Such positioning is not critical but can allow pitch and roll to be adjusted independently when achieved.

Figure 2:
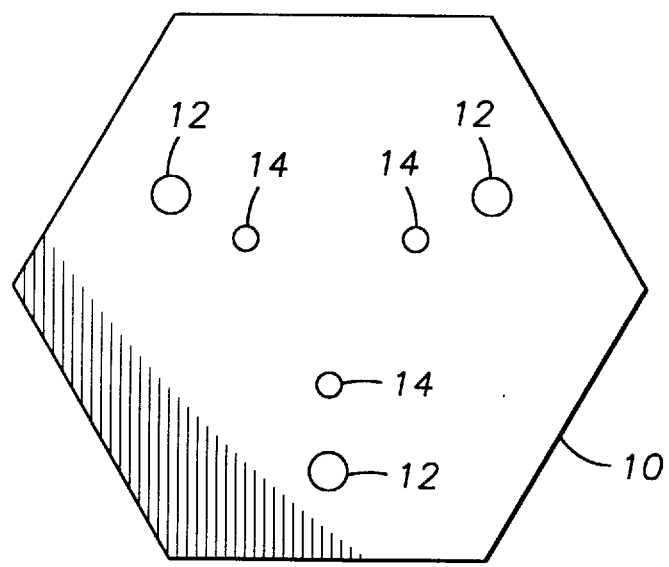
FIG. 2 is a view of an alternative keypad for the apparatus of FIG. 1.

FIG. 2 shows an alternative "Y" arrangement for the bubble switches on keypad 10 useful when the adjustment of a surface is not limited to pitch and roll or when the first line A of bubble switches 12, 14 in a T formation cannot be reliably oriented perpendicular to the pitch or roll axis. In the alternative embodiment, the first set of bubble switches 12 having the first actuating distance and the second set of bubble switches 14 having the second actuating distance achieve maximum spacing for the available keypad area. Of course, additional bubble switches and a variety of configurations can be used if additional information is needed to assist in aligning the surfaces.

The keypad 10 is conveniently a semi-rigid plastic or flexible elastomeric membrane having a thickness smaller than the smallest actuating distance of the bubble switches 12, 14, 16. The switches are preferably molded into the membrane as seen on some calculator keyboards although the method of fixing the placement of the switches is not critical.

In order to align two surfaces, the membrane 10 is placed between the surfaces, preferably with the first line A of the bubble switches 12, 14 oriented perpendicular to an axis of rotation, and the surfaces are moving together until the display 20 shows that one or more switches is actuated. The information provided by the switches guides alignment of the surfaces to achieve essentially simultaneous actuation of all switches having an actuating distance which corresponds to a desired alignment of the surfaces when the surfaces are moved within the actuating distances of the switches.

The apparatus and method are especially useful for aligning parallel surfaces in chemical vapor deposition equipment for making integrated circuits as described below. However, the apparatus and method have much broader utility and the scope of the present invention is defined by the claims and not the descriptions of embodiments.

Description of a Preferred Embodiment

Chemical vapor deposition (CVD) is a process often used in the fabrication of integrated circuits to form thin films on the surface of substrates. CVD processes, such as those used in the fabrication of integrated circuits, are carried out in process chambers which typically include a gas distribution plate through which gases are introduced into the process chamber. Gas distribution plates are commonly utilized in CVD chambers to uniformly distribute gases over the substrate surface upon their introduction into the chamber. Uniform gas distribution is necessary to enhance uniform deposition characteristics on the surface of a substrate positioned in the chamber for processing.

Figure 3:
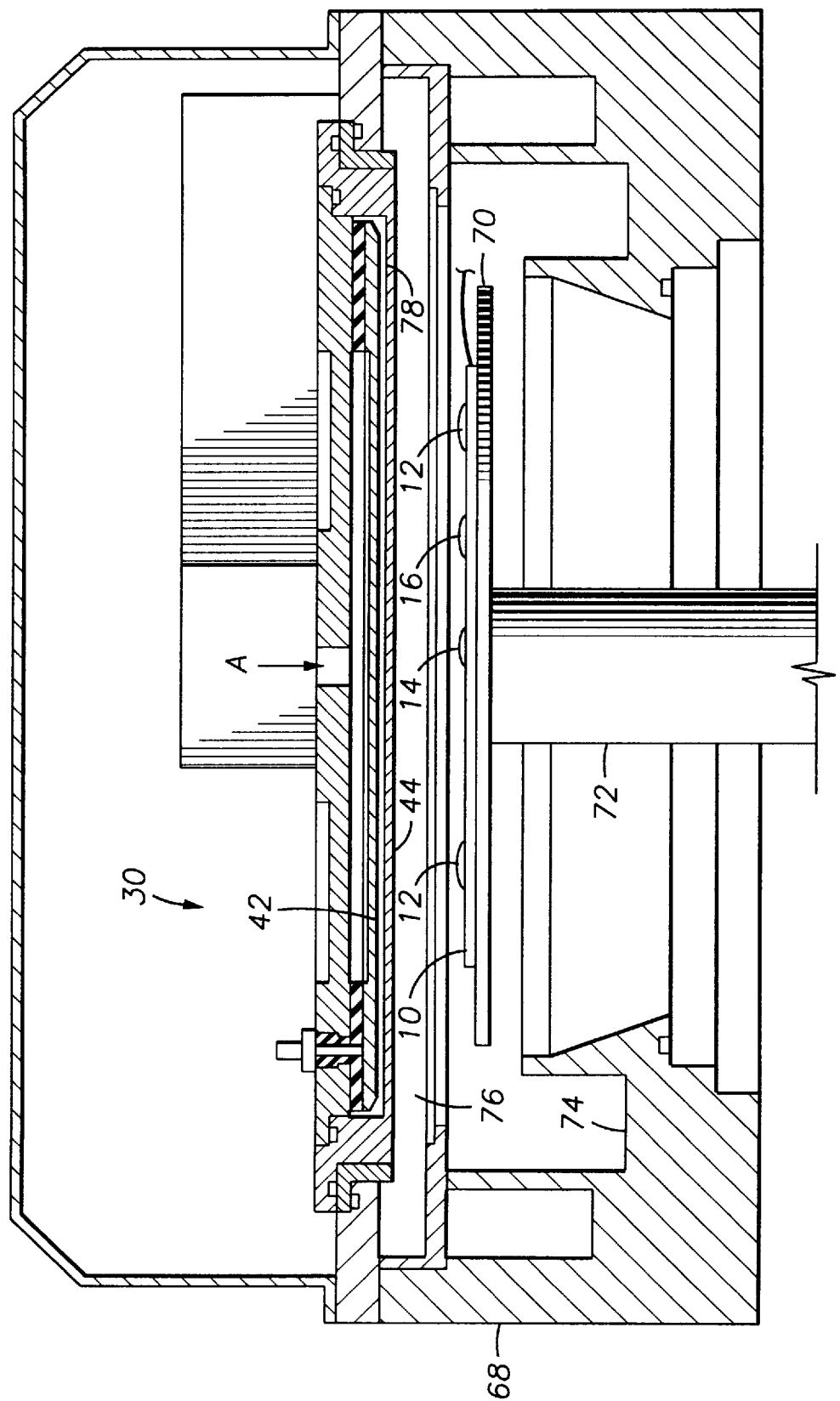
FIG. 3 is a cross-sectional view of a chemical vapor deposition chamber having surfaces in close proximity, and the keypad of FIG. 1 positioned between two surfaces in close proximity to align the surfaces in parallel.

FIG. 3 shows a sectional view of a chemical deposition chamber 30 which contains several vapor distribution plates. The vapor or gas enters the deposition chamber at point A and passes through a perforated blocker plate 42 and a perforated face plate 44 to evenly disperse gases over a work piece (not shown). The blocker plate 42 is generally a flat member having a plurality of very small apertures or holes therethrough to disperse the gas inlet therein uniformly into a space above the face plate 44. The gas is typically inlet from a single gas line wherein the reactant and carrier gases have been mixed, thereby providing a high concentration of gas over the center of the blocker plate 42 at a localized area. The face plate 44 is also a generally flat member having a plurality of small apertures or holes, which holes are larger than the holes in the blocker plate 42, through which the gases pass or diffuse to provide a uniform concentration of gases evenly over the work piece. The face plate 44 is typically disposed below the blocker plate 42 and at least partially forms the upper boundary of the processing region 76 of the chamber. Accordingly, the gases flow through the small apertures of the blocker plate 42 and subsequently through the apertures of the face plate 44 and into the chamber where they undergo plasma assisted chemical reactions.

In a typical chemical vapor deposition, a work piece (not shown) is positioned within the processing region 76 on a substrate support plate 70. The gases are dispersed above the blocker plate 42 and pass through the apertures formed in the blocker plate and into a space 78 above the face plate 44. The gases are then further dispersed over the upper surface of the face plate 44 and pass through the apertures formed in the face plate to uniformly distribute the gases over the work piece on the substrate support plate 70 where the gases react with one another and deposit on the work piece.

The deposition chamber 30 includes chamber walls 68. Substrate support member 72 is an adjustable shaft which holds the substrate support plate 70 in place and includes a motor for raising, such as a stepper motor, and means for adjusting the pitch and roll of the substrate support plate 70. The support member 72 is disposed in the lower portion of the chamber and extends through the lower wall of the chamber. A vacuum exhaust channel 74 is disposed about the outer perimeter of the substrate support member to uniformly exhaust gases from the chamber.

In order to adjust the alignment of the face plate 44 and the substrate support plate 70, the keypad 10 of FIG. 1 is placed on the substrate support plate 70 as shown in FIG. 3 with the first line A of bubble switches 12, 14 preferably positioned perpendicular to the pitch axis or the roll axis of the support plate 70. The wires 12 can be passed through the exhaust channel 74 so that the hand held display 20 can be operated outside the chamber.

The deposition chamber 30 typically has a desired 300 mil (0.300 in.) separation between the face plate 44 and the substrate support plate 70. For this distance, the preferred actuating distances for the bubble switches 12, 14 are 306 mil for the first set of switches 12 and 294 mil for the second set of switches 14. Intermediate switch 16, if present, preferably has an actuating distance of 300 mil. The LEDs 22, 24, 26 preferably illuminate when each corresponding switch is actuated and preferably remain illuminated until the corresponding switch is released or the system is reset.

Using the described apparatus, alignment of the surfaces of the plates 44 and 70 is achieved by adjusting the vertical movement of the support plate 70 so that raising of the support plate 70 actuates one or both of the first switches 12 on line A without actuating either of the second switches 14 on line A. If only one first switch 12 on line A actuates, the pitch or roll can be adjusted so that raising of the support plate 70 simultaneously actuates both of the first switches 12 on line A without actuating either of the second switches 14 on line A. Then the remaining adjustment, pitch or roll, can be adjusted so that raising of the support plate 70 simultaneously actuates all of the first switches 12 on lines A and B without actuating any of the second switches 14.

The second set of switches 14 assist in aligning the plates 44, 70 by indicating when the plates are too close together to achieve parallel alignment at a separation of about 300 mil. The second set of switches 14 would be unnecessary if the support plate 70 could be raised slowly to confirm essentially simultaneous actuation of the first switches 12. However, the support plate 70 is designed to be raised quickly into position and alignment would be difficult without the second set of switches 14.

The intermediate switch 16 is useful in judging the effect of any final adjustments after achieving simultaneous actuation of the first switches 12 on line A, and is also useful in making any final adjustments to the vertical movement of the support plate 70 to achieve a separation of about 300 mil between the support plate 70 and the face plate 44.

While the foregoing is directed to the preferred embodiment of the present invention, other and further embodiments of the invention may be devised without departing from the basic scope thereof. The scope of the invention is determined by the claims which follow.

We claim:

1. An apparatus for aligning surfaces in close proximity, comprising:

at least three travel sensitive switches disposed between the surfaces, each switch having a known actuating distance; and a display connected to the switches to show the status of each switch.

2. The apparatus of claim 1, wherein the switches are molded within a keypad.

3. The apparatus of claim 2, wherein the keypad holds at least a first set of three switches having a first actuating distance and a second set of three switches having a second actuating distance.

4. The apparatus of claim 3, wherein the switches are aligned in a T formation.

5. The apparatus of claim 1, further comprising:

an actuator connected to one of the surfaces to be aligned to provide pitch and roll adjustments to the surface.

6. The apparatus of claim 3, wherein the switches are aligned in a Y formation.

7. The apparatus of claim 3, wherein the first set of switches and the second set of switches are positioned in corresponding pairs.

8. A process for aligning surfaces in close proximity, the process comprising the steps of:

placing at least three travel sensitive switches between the surfaces, each switch having a known actuating distance and each switch directly monitored by a display showing the status of the switch;

moving the surfaces together until the display shows that one or more switches is actuated; and adjusting the alignment of the surfaces to achieve essentially simultaneous actuation of all switches having actuating distances which correspond to a desired alignment when the surfaces are moved within the actuating distances of the switches.

9. The process of claim 8, wherein the switches are molded within a keypad.

10. The process of claim 9, wherein the keypad holds at least a first set of three switches having a first actuating distance and a second set of three switches having a second actuating distance.

11. The process of claim 10, wherein the switches are aligned in a T formation.

12. The process of claim 11, wherein the pitch and roll of the surfaces are adjusted separately.

13. The process of claim 12, wherein the first set of switches have an actuating distance of 306 mil and the second set of switches have an actuating distance of 294 mil.

14. A process for aligning a support plate with a vapor distribution plate in a chemical deposition chamber, comprising the steps of:

placing a membrane containing at least six travel sensitive switches on the support plate, the switches including a first set of at least three switches having a first actuating distance and a second set of at least three switches having a second actuating distance, each switch being monitored by a display showing the status of the switch;

adjusting the vertical movement of the support plate so that raising of the support plate actuates one or more of the first switches without actuating any of the second switches; and adjusting the alignment of the support plate so that raising of the support plate actuates all of the first switches without actuating any of the second switches.

15. The process of claim 14, wherein the switches are aligned in a T formation and a line containing two of the first switches is placed perpendicular to the pitch or roll axis of the support plate.

16. The process of claim 15, wherein the pitch and roll of the support plate are adjusted separately.

17. The process of claim 16, wherein the first set of switches have an actuating distance of 306 mil and the second set of switches have an actuating distance of 294 mil.

18. A method for aligning surfaces in close proximity, comprising:

placing a first set of at least three travel sensitive switches between the surfaces, each switch having a first actuating distance;

monitoring a display showing each switch's status;

moving the surfaces in close proximity until the display shows that the first set of switches are substantially simultaneously actuated.

19. The method of claim 18, further comprising:

placing a second set of at least three travel sensitive switches between the surfaces, each switch having a second actuating distance.

20. The method of claim 19, wherein the step of moving the surfaces comprises:

moving the surfaces in close proximity until the display shows that the first set of switches are substantially simultaneously actuated and that none of the second set of switches are actuated.

* * * * *